United States Patent [19]
Gobbi et al.

[11] Patent Number: 5,126,599
[45] Date of Patent: Jun. 30, 1992

[54] PRE-DIFFUSED LOGIC CIRCUIT INCLUDING AT LEAST ONE AMPLIFIER COMPRISING PARALLEL-CONNECTABLE TRANSISTORS

[75] Inventors: José M. Gobbi, Paris; Louis Le Berre, Les Ulis, both of France

[73] Assignee: Thomson Composants Microondes, Puteaux, France

[21] Appl. No.: 593,744

[22] Filed: Oct. 5, 1990

[30] Foreign Application Priority Data

Oct. 31, 1989 [FR] France ................. 89 14288

[51] Int. Cl.⁵ .......................................... H03K 17/04
[52] U.S. Cl. .................... 307/465; 307/475; 307/303.2
[58] Field of Search ........... 307/465, 468, 475, 270, 307/303.2

[56] References Cited

U.S. PATENT DOCUMENTS

| | | | |
|---|---|---|---|
| 4,682,202 | 7/1987 | Tanizawa | 307/465 X |
| 4,727,266 | 2/1988 | Fujii et al. | 307/303.2 X |
| 4,864,381 | 9/1989 | Seefeldt et al. | 307/465 X |
| 4,904,886 | 2/1990 | Tanahashi | 307/468 X |
| 4,933,576 | 6/1990 | Tamamura et al. | 307/465 |

OTHER PUBLICATIONS

IEEE Journal of Solid–State Circuits, vol. SC–19, No. 5, Oct. 1984, pp. 728–738, IEEE, N.Y., U.S.; R. N. Deming et al.; "A Gallium Arsenide Configurable Cell Array Using Buffered Fet Logig".
IEEE GaAs IC Symposium, Boston, Mass., Oct. 23–25, 1984, pp. 15–18, IEEE, N.Y., U.S.; R. N. Deming et al.; "A Gallium Arsenide Configurable Cell Array Using Buffered FET Logic".
E.D.N. Electrical Design News, vol. 27, No. 22, Nov. 1982, pp. 113–117, Boston, Mass., U.S.: R. Pate et al.; "Observe Simple Design Rules When Customizing Gate Arrays".
Patent Abstracts of Japan, vol. 11, No. 217 (E–523 [2664], Jul. 14, 1987; & JP–A–62 35 716 (Hitachi Ltd.) Feb. 16, 1987.

Primary Examiner—David Hudspeth
Attorney, Agent, or Firm—Oblon, Spivak, McClelland, Maier & Neustadt

[57] ABSTRACT

Disclosed is a pre-diffused logic integrated circuit, a part of which is converted into an analog circuit. A pre-diffused logic circuit includes a plurality of logic circuits, each formed by non-wired signal transistors. If the fan-out of a logic operator has to be increased, the transistors of a neighboring logic cell are parallel mounted so that at least two signal transistors are parallel mounted to make an amplifier transistor therefrom and at least two transistors are connected to make a current source therefrom for this amplifier. This conversion is done during the final metallizations for customizing the pre-diffused circuit.

The present invention finds particular application in fast logic circuits.

5 Claims, 1 Drawing Sheet

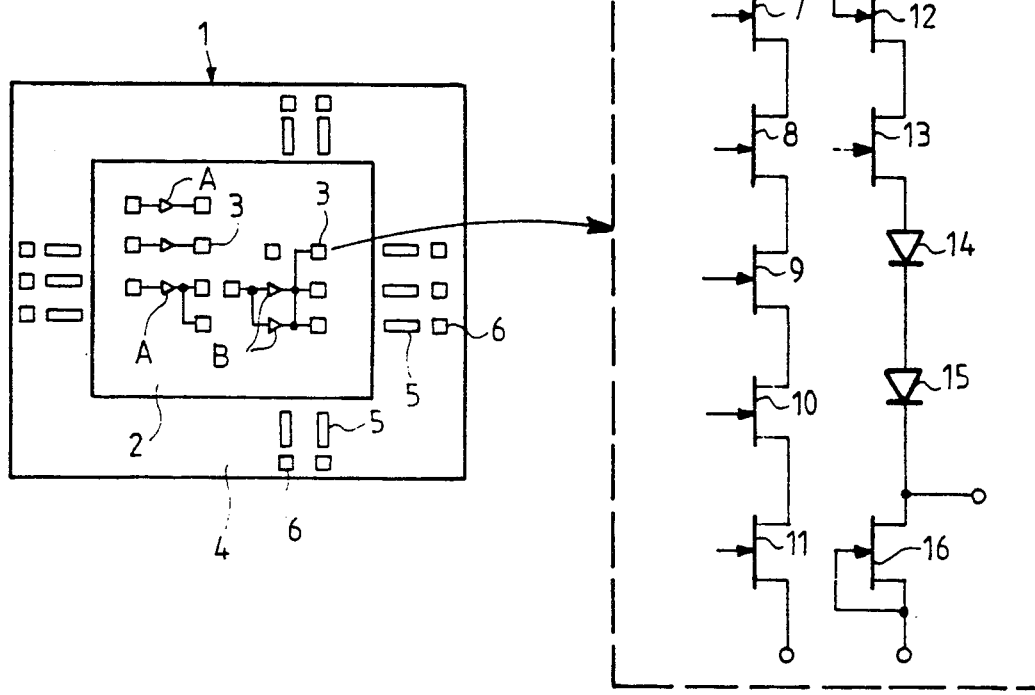
FIG_1
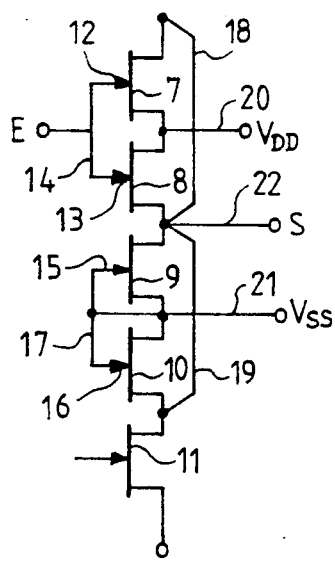
FIG_2
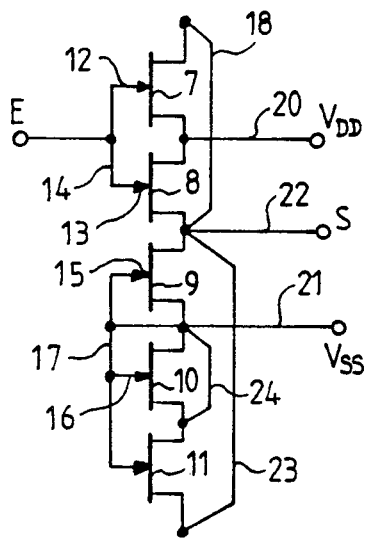
FIG_3

PRE-DIFFUSED LOGIC CIRCUIT INCLUDING AT LEAST ONE AMPLIFIER COMPRISING PARALLEL-CONNECTABLE TRANSISTORS

BACKGROUND OF THE INVENTION

1. Field of the Invention

The present invention concerns the partial conversion of a pre-diffused logic circuit, as well as the converted integrated circuit in which the transistors of one or more logic cells are used in order to set up a power amplifier, located among the logic cells.

2. Description of the Prior Art

It is known that pre-diffused integrate circuits are circuits comprising components, namely simple components like transistors or more complex ones like logic operators, that are not mutually interconnected. They are non-specific circuits that are customized according to the needs of the users, by means of one or more metallizations of interconnections.

However, from the very moment of their designing, pre-diffused circuits have a certain orientation: some are designed to become analog circuits while others are designed to become logic circuits. In the case of logic circuits, the pre-diffused transistors have low noise and low power characteristics, so that the logic "core" of the chip of semiconductor material has to be surrounded by a belt of amplifier interface circuits.

If a logic operator has to possess a high fan-out, either because it is addressed to a plurality of other logic operators or because it is connected by a long connection, it becomes necessary to come out of the "core" of the chip to amplify the signals by a so-called "buffer" circuit, and then to re-enter the core towards the logic operators. There is no optimization of the interconnections, and the long connections attenuate the signals, or set up interference.

SUMMARY OF THE INVENTION

The method according to the invention comprises using the signal transistors of a logic cell in a pre-diffused logic integrated circuit, and in interconnecting these transistors so as to make an amplifier therefrom. The logic integrated circuits according to the invention are characterized by the presence, within a "sea of logic operators", namely at the core of the chip, of at least one amplifier, connected to the neighboring logic operators by direct and short interconnections.

More precisely, the invention concerns a pre-diffused logic integrated circuit comprising, on a chip of semiconductor material, a central region formed by logic cells, each one of which includes a plurality of signal transistors adapted to the making of logic operators, namely an integrated circuit wherein, in order to increase the fan-out of a logic operator, it includes, in its central region, at least one amplifier made by means of the signal transistors of at least one logic cell, by the parallel mounting of the signal transistors.

BRIEF DESCRIPTION OF THE DRAWINGS

The invention will be understood more clearly from the following description of two exemplary embodiments, made with reference to the appended drawings, of which:

FIG. 1 shows a schematic view of a chip of a pre-diffused integrated circuit according to the invention;

FIG. 2 shows a first example of the conversion of a logic operator into an amplifier, according to the invention;

FIG. 3 shows a second example of the conversion of a logic operator into an amplifier, according to the invention.

DETAILED DESCRIPTION OF THE INVENTION

Customizable integrated circuits are said to be pre-diffused when they are made of silicon, or pre-implanted when they are made of GaAs or group III-V semiconductor materials since no diffusions are made in these materials. However, in order to simplify the text, the term "pre-diffused" alone shall be used, without thereby restricting the scope of the invention which covers all the semiconductor materials.

A pre-diffused logic integrated circuit is shown very schematically in the left-hand part of FIG. 1. The chip 1 of the circuit has a "core" or central part 2, formed by an array or checkerboard of cells 3 capable of fulfilling certain logic functions after they have been customized, i.e. after they have received the necessary metallizations. The periphery of the chip has a belt 4 of interface circuits 5 and wiring contacts 6. The interfaces 5 are either input/output interfaces or interfaces for internal or external amplification.

At the right-hand part of FIG. 1, there is a pre-diffused cell 3 shown enlarged, surrounded symbolically by a line of dashes. This type of cell is known. It contains, for example, a plurality of transistors 7 to 11, and a shifter stage consisting of two transistors 12 and 13, two shift diodes 14 and 15, and a current source 16. In this state of the pre-diffused circuit, the connections are not wired by metallizations, so that the cells, which are all identical, may be converted into inverters, or into different logic operators, such as AND operators, NAND operators, with different numbers of inputs, or into combinations of logic operators.

Depending on the user's design, and despite a search for optimization of the networks of metallizations, the rate of use of the pre-diffused cells is never equal to 100%: cells are unused. But it is also frequently the case that a logic operator, given the nature of the signal transistors, has an insufficient fan-out, either because this logic operator drives several logic operators or because it is connected to another logic operator by a long metallization, and this results in a stray capacitance. In this case, the output signal must be amplified to obtain the necessary fan-out; according to the prior art, amplifiers 5 are used for this purpose. These amplifiers are arranged on the belt 4 which surrounds the chip of the pre-diffused circuit. But this entails lengthy connections between the core of the chip and the belt.

According to the present invention, the signal transistors of one or more pre-diffused logic cells, in the core of the chip, are used and wired so as to be converted into power amplifiers. These amplifiers are therefore located within a logic array, and each of them is connected to a logic operator by a short connection, hence one that is neither capacitive nor subjected to strays. This is possible because the pre-diffused logic cells are practically not used to 100%. In FIG. 1, some logic cells converted into amplifiers are designated by the letter A.

Let us consider a pre-diffused logic cell such as the one of FIG. 1 in which only the input transistors 7 to 11 are used, and the output stage is not used to convert it into an amplifier. If the design of this logic cell had another architecture (BFL, LPFL, DCFL etc.), that would not modify the invention, the basis of which lies in the grouping together of signal transistors to obtain a small power value therefrom. Two examples thereof are shown in FIGS. 2 and 3.

In a pre-diffused logic circuit, the transistors are grouped together in lines, and the region located between two gates constitutes the source of a first transistor and the drain of a second transistor. To group together two transistors in parallel, this common region is taken as a first access electrode while the two end regions, namely the drain of the first transistor and the source of the second transistor, are connected by a metallization. The two gates are connected together by another metallization.

Thus, in FIG. 2, the row of transistors 7, 8, . . . 11 has a sequence of common drain-source regions between each of the signal transistors. To make an amplifier therefrom, the gates are grouped together; the gate 12 of the first transistor 7 and the gate 13 of the second transistor 8 are connected by a metallization 14 which constitutes the input E of the amplifier. In the same way, the gate 15 of the third transistor 9 and the gate 16 of the fourth transistor 10 are connected by a metallization 17. Also, the drain of the first transistor 7 is connected to the source of the second transistor 8 by a metallization 18, and the drain of the third transistor 9 is connected to the source of the fourth transistor 10 by a metallization 19.

The supply to this amplifier is provided by a voltage $V_{DD}$ applied by a metallization 20 to the common point between the first transistor 7 and second transistor, and by a voltage $V_{SS}$ applied by a metallization 21 to the common point between the third transistor 9 and fourth transistor 10. The metallization 21 is in contact with the metallization 17, since the transistors 9 and 10 are parallel-mounted current sources. The output S of the amplifier is taken at a metallization 22 at the common point between the second transistor 8 and third transistor, i.e. between the input transistor 7+8 and its current source 9+10.

This architecture implies that the number of transistors used is an even number. In fact, if the logic cell converted into an amplifier includes an odd number of transistors, for example five as shown, the transistor 11, which is unused but coupled by the pre-diffused regions, provides a stray capacitance in parallel with the output.

Another architecture is preferable if the number of transistors used is an odd number, as shown in FIG. 3. There is no change for the input transistor formed by the two parallel-mounted transistors 7 and 8, nor for the supplies $V_{DD}$ and $V_{SS}$ and for the output S. But the current source is formed by the three transistors 9, 10 and 11, the three gates of which are connected together, the three transistors 9, 10 and 11 being parallel-mounted, when taken two by two, by the metallizations 23 and 24. According to this architecture, the stray capacitance of the fifth transistor 11 is in parallel with the supply, and no longer with the output.

More generally, the power of this amplifier can be increased by the parallel mounting of more than two transistors in one and the same pre-diffused cell 3. By way of an example, the power of the amplifier of FIG. 3 can be multiplied by a factor "n" through the parallel mounting of "n" logic cells (close to one another, on the chip of the integrated circuit) wired as an amplifier according to the present invention. In FIG. 1, an amplifier formed by two logic cells, converted into an amplifier with two parallel-mounted stages, is designated by the letter B.

The value of this invention lies in the fact that it enables amplifiers to be laid out at any point of a logic circuit, with short connections, since it is certain logic cells that will be converted into amplifiers.

What is claimed is:

1. A pre-diffused logic integrated circuit formed on a chip of semiconductor material, comprising:
   a central region formed by logic cells, each logic cell comprising a plurality of signal transistors, said signal transistors being interconnected to form logic operators;
   at least one amplifier, located in the central region, formed by a parallel connection of a predetermined number of said signal transistors of at least one logic cell, thereby increasing a fan-out of a logic operator.

2. An integrated circuit according to claim 1, wherein said at least one amplifier is formed in a logic cell comprising at least four signal transistors, wherein two first signal transistors are connected in parallel to form a power input transistor, and two second signal transistors are connected in parallel to form a power current source.

3. An integrated circuit according to claim 1, wherein said at least one amplifier is formed by means of at least two logic cells connected in parallel, the signal transistors of each of the logic cells being themselves connected in parallel as amplifiers.

4. A pre-diffused logic integrated circuit formed on a chip of semiconductor material, comprising:
   a central region formed by logic cells, each logic cell comprising a plurality of signal transistors, said signal transistors being interconnected to form logic operators;
   at least one amplifier, located in the central region, formed by a parallel connection of a predetermined number of said signal transistors of at least one logic cell, thereby increasing a fan-out of a logic operator;
   wherein said at least one amplifier is formed in a logic cell comprising an odd number of signal transistors, wherein an even number of first signal transistors are connected in parallel to form a power transistor, and a predetermined number of second signal transistors are connected in parallel to form a power current source.

5. A pre-diffused logic integrated circuit formed on a chip of semiconductor material, comprising:
   a central region formed by logic cells, each logic cell comprising a plurality of signal transistors, said signal transistors being interconnected to form logic operators;
   at least one amplifier, located in the central region, formed by a parallel connection of a predetermined number of said signal transistors of at least one logic cell, thereby increasing a fan-out of a logic operator; and
   at least one amplifier analog gate, located among the logic operators, connected to the logic operators by short metallizations.

* * * * *